United States Patent [19]

Gersbach et al.

[11] Patent Number: 4,604,531

[45] Date of Patent: Aug. 5, 1986

[54] IMBALANCE CIRCUITS FOR DC TESTING

[75] Inventors: John E. Gersbach, Burlington; John J. Moser, Essex Junction, both of Vt.

[73] Assignee: International Business Machines Corporation, Armonk, N.Y.

[21] Appl. No.: 517,140

[22] Filed: Jul. 25, 1983

[51] Int. Cl.⁴ .................. H03K 19/20; H03K 5/08
[52] U.S. Cl. ................................ 307/445; 307/443; 307/565
[58] Field of Search ............. 307/445, 565, 300, 443, 307/455, 467

[56] References Cited

U.S. PATENT DOCUMENTS

| 2,964,652 | 12/1960 | Yourke | 307/445 |
| 3,505,535 | 4/1970 | Cavaliere | 307/300 |
| 3,541,441 | 11/1970 | Hrustich | 324/73 |
| 3,795,859 | 3/1974 | Benante et al. | 324/73 |
| 4,041,326 | 8/1977 | Robinson | 307/216 |

OTHER PUBLICATIONS

IBM Tech. Disclosure Bulletin, Programmable Swing Current Switch for Low-Power High Speed Circuits, H. D. Varadrajan, vol. 19, No. 10, Mar. 1977, p. 3736.
IBM Technical Disclosure Bulletin, vol. 21, No. 8, Jan. 1979, pp. 3107-3108 entitled "Sense Signal Characterization and Test for One-Device Dynamic Memory".

Primary Examiner—John S. Heyman
Assistant Examiner—B. P. Davis
Attorney, Agent, or Firm—Francis J. Thornton

[57] ABSTRACT

This teaches that logic circuits such as Cascode circuits can be D.C. tested for normally untestable defects, such as emitter shorts or collector opens, by applying to the output of the circuit, or portion of the circuit, under test an additional voltage though an impedance. The specific embodiment teaches a resistor and diode in series as the impedence.

4 Claims, 1 Drawing Figure

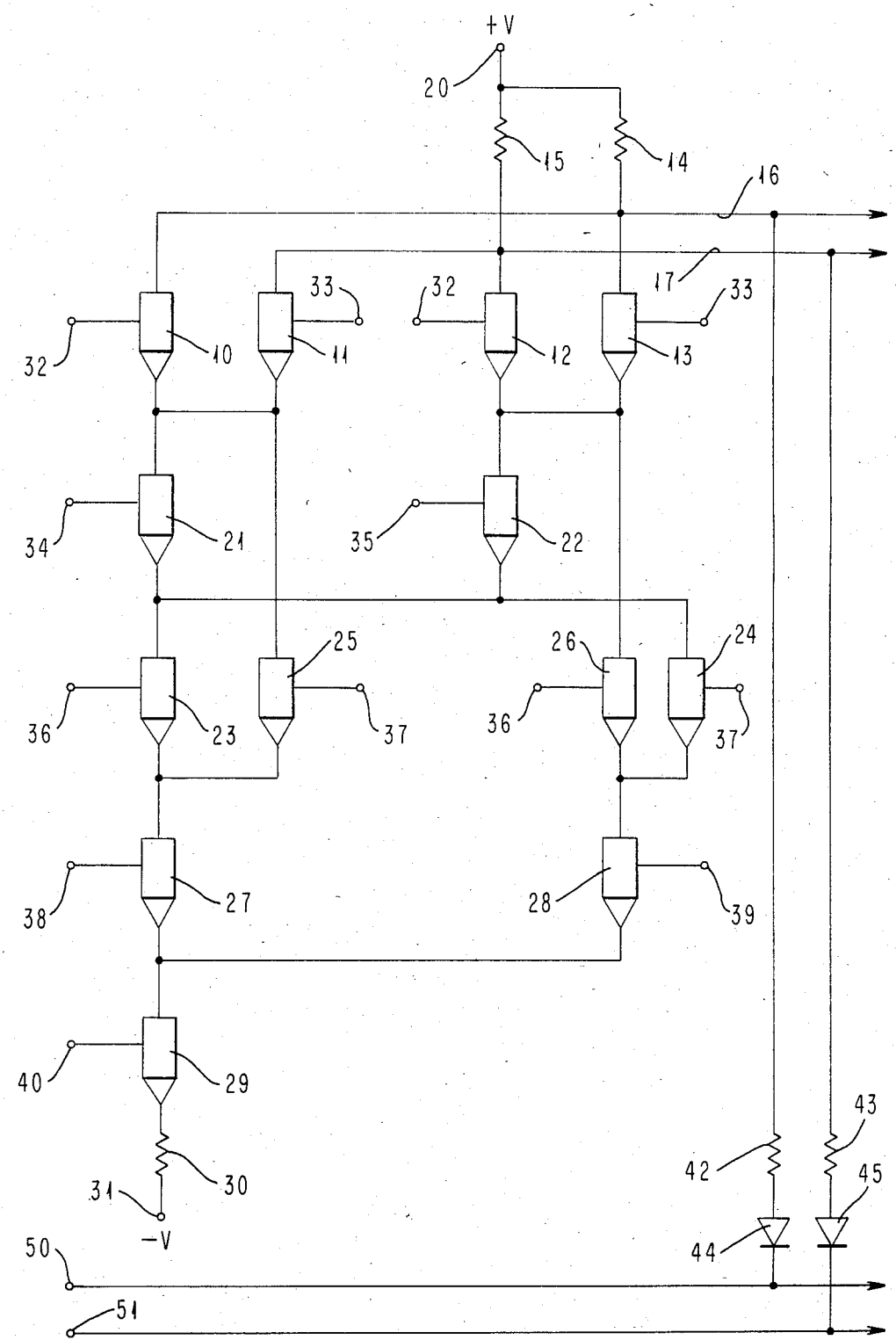

4,604,531

IMBALANCE CIRCUITS FOR DC TESTING

BACKGROUND OF THE INVENTION

This relates generally to circuits used in logic chains or systems and more particularly to a method of testing indeterminate outputs of cascode circuits with a DC test.

Certain implementations of logic circuits exhibit defect characteristics which significantly complicate the level of testing required of such circuits. Any defect which causes the product level to become indeterminate, i.e., of the same voltage level, is particularly impossible to detect with a DC test. When one circuit in a logic chain has an indeterminate output the operation of the next circuit in the logic chain is unpredictable. Hithertofore, any such indeterminate output was untestable by standard DC testing techniques since the response for such defective circuits was unpredictable.

The present invention is therefore directed toward a logic circuit that can be tested for defects within the circuit which would normally create indeterminate outputs. Moreover by modification of the circuit in accordance with the present invention such testing can be done with a simple DC stuck fault test.

In particular the invention describes a cascode circuit that can be tested for defects that normally create indeterminate outputs with a simple DC stuck fault test.

BACKGROUND ART

IBM Technical Disclosure Bulletin, Vol. 21, #8, January 1979, pgs. 3107-3108, describes the testing of dynamic memory chips by utilizing offset voltages during testing to determine the sensitivity of the latch and to allow an allowable operating region without physically probing the circuitry.

U.S. Pat. No. 3,795,859 teaches the testing of a memory cell in which the voltage conditions on one of the bit lines is varied.

U.S. Pat. No. 3,541,441 describes the testing of logic circuits and utilizes drivers 12 which provide variable adjustable signals.

SUMMARY OF THE INVENTION

The present invention is especially directed toward a modified logic circuit in which defects which normally cause indeterminate outputs can be tested with a simple DC stuck fault test.

More particularly the invention is a cascode circuit provided with a pair of additional voltage inputs coupled between the outputs of the cascode circuit through an impedance preferably comprising a resistor and a diode in series.

From the foregoing, it can therefore be seen that an object of the present invention is to provide an improved logic circuit which can be tested for defects which normally cause untestable indeterminate outputs.

This and other objects of the present invention will become more apparent when taken in conjunction with the following description and drawing wherein there is set forth a specific embodiment of the present invention.

BRIEF DESCRIPTION OF THE DRAWING

FIG. 1 illustrates in schematic form a cascode logic circuit embodying the present invention.

DESCRIPTION OF THE PREFERRED EMBODIMENT

The cascode logic circuit illustrated in the schematic diagram of FIG. 1 develops very high speed exclusive logic functions with the unique property that the output function and its complement are propagated virtually simultaneously and although the circuit may be modified as dictated by output and input requirements the circuitry is always such that its operation is dependent upon one of a number of mutually exclusive conductive parts corresponding to the various states of the exclusive function established by the circuit.

In FIG. 1, there are shown two pairs of transistors 10, 11, 12, and 13. The collectors of transistors 10 and 13 coupled together and to a first output line 16 and through a resistor 14 to a voltage source 20. Similarly, the collectors of transistors 11 and 12 are both coupled to a second output line 17 and through a resistor 15 to the voltage source 20. The emitters of transistors 10 and 11 are connected together and to the collector of transistor 21. Similarly transistors 12 and 13 have their emitters coupled together and to the collector of a transistor 22, the emitter of which is connected to the emitter of transistor 21 and to the collector of a second pair of transistors 23 and 24. The emitters of transistors 10 and 11 are also coupled to the collector of a transistor 25 whose emitter is coupled to the emitter of transistor 23 while the emitter of transistors 12 and 13 are coupled to the collector of a transistor 26 whose emitter is coupled to the emitter of transistor 24. The emitters of transistors 23 and 25 are also coupled to the collector of a transistor 27 while the emitters of transistors 26 and 24 are coupled to the collector of a transistor 28 whose emitter is coupled to the emitter of transistor 27 and to the collector of a transistor 29 whose emitter is coupled through a resistor 30 to a negative voltage source 31.

The bases of transistors 10 and 12 are both coupled to the same input terminal 32. Similarly the bases of transistors 11 and 13 are both coupled to the same input terminal 33. The signals being applied to terminal 33 being the complement of the signals being applied to terminal 32. Similarly the base of transistor 21 is coupled to a terminal 34 while the base of transistor 22 is coupled to a terminal 35 which receives the complementary signal of that applied to terminal 34. Again transistors 23 and 26 have their bases coupled to a common terminal 36 while the bases of transistors 24 and 25 are coupled to another common terminal 37. It should be noted that terminal 36 is connected to a signal source while 37 is connected to the complement of the signal source applied on terminal 36. Finally, transistors 27 and 28 are coupled to signal sources 38 and 39 respectively with terminal 39 being connected to the complementary input of terminal 38. Transistor 29 has its base connected to an always on regulated positive voltage source 40. An additional voltage source 50 is coupled to line 16 via an impedance comprising a resistor 42 in series with a diode 44. Similarly still another voltage source 51 is coupled to line 17 via a different impedance comprising a resistor 43 in series with a diode 45.

The operation of the basic cascode circuitry of FIG. 1 is straight forward. With the circuit shown connected only to the voltage source 20 and the voltage source 31 and no signal applied to any of the bases of the transistors except transistor 40 there is no conduction through the circuit and the voltage level appearing at the output terminals 16 and 17 will be substantially that of the voltage source 20 and the lines will be in the so-called "high state". However, when selected transistors are turned on and there is conduction of current between the voltage supply 20 and the voltage supply 31 the signal level at one of the output lines 16 and 17 will be brought down to its so-called low state. For example, let it be assumed that terminals 32, 34, 36, and 38 are all made positive turning on the transistors 10, 12, 21, 23, 26, and 27. Although transistors 12 and 26 are turned on they are not effective since transistors 22 and 28 are not conductive because terminals 35 and 39 are coupled to the complement signal of that applied to terminals 34 and 38, that is, they are biased negative holding transistors 22 and 28 off. Thus there is only one predetermined current path between sources 20 and 31 through resistor 14 and transistors 10, 21, 23, 27 and 40 and resistor 30 and line 16 is pulled low. Since there is no conductive current path from the voltage source 20 through resistor 15 to the voltage source 31 the line 17 remains high and a differential signal is developed between lines 16 and 17.

In some cases in these cascode circuits a defect can occur which will cause the output of lines 16 and 17 to be indeterminate. An indeterminate output being defined as one in which the outputs on lines 16 and 17 are essentially at the same voltage level regardless of the signals applied to the input terminals so that the output of any following logic circuit to which these lines lead becomes unpredictable. Defects which can cause such indeterminate outputs include, for example, base emitter shorts or open collectors in any of the transistors in the circuit.

Any such defect which creates such an indeterminate output causes the entire logic circuit of which it is a part to be untestable by standard DC testing techniques. The present invention solves this problem and teaches that such faults may be detected in such a circuit with a DC test by electrically unbalancing the output lines 16 and 17 during testing. If the circuit is unbalanced in favor of line 16 then an indeterminate output will be interpreted as line 16 being high and line 17 being low. Conversely if the circuit is unbalanced in favor of line 17 then an indeterminate output will be interpreted as line 16 being low and line 17 being high.

In testing of the circuit it is necessary that line 16 first be unbalanced in favor of line 17 and then line 17 is unbalanced in favor of line 16 such that defects which create indeterminate outputs and typically require an AC test can be tested with a DC tester.

To accomplish this end the cascode circuit described above is modified as shown in FIG. 1 by coupling two voltage inputs 50 and 51 to lines 16 and 17 by suitable impedance networks. As shown these networks comprise resistors 42 and 43 in series with diodes 44 and 45. Thus line 50 is coupled to line 16 through diode 44 and resistor 42 and line 51 is coupled through resistor 43 and diode 45 to line 17. For each circuit output of the cascode circuit an additional output line and impedance, i.e., a diode-resistor pair must be added.

During normal operation of the circuit the inputs 50 and 51 are set to a voltage equal to or more positive than that appearing on source 20 causing diodes 44 and 45 to be non conductive. In this case the circuit operates as if there were no modification. By reducing the voltage on, for example, the input 50, to a level below that on line 16 the diode 44 becomes forward biased and current flows from source 20 through resistors 14 and 42, and diode 44 to the input line 50. The voltage on line 16 will thus be reduced due to this current flow. The magnitude of the applied imbalance must be substantially less than that of the normal voltage levels. This operation effectively unbalances the circuit in favor of the line 17, i.e., line 16 is brought low while line 17 remains unchanged. Reversing the voltages on nodes 50 and 51 will similarly unbalance the circuit in favor of line 16.

Thus there has been described a cascode circuit which during operation can have selected inputs applied to its output line to unbalance the output lines to permit DC stuck fault testing of the unbalanced lines to avoid and access defects which would normally result in an indeterminate output.

While the invention has been particularly described with reference to the preferred embodiment thereof it would be understood by those skilled in the art that changes in forms and details can be made in the foregoing preferred embodiment without departing from the spirit and scope of the invention.

What is claimed is:

1. A logic circuit array comprising;
   a plurality of logic circuits coupled to a pair of output lines and to a first voltage source,
   each of said logic circuits comprising a plurality of emitter coupled transistors, arranged in a cascode configuration and coupled between said pair of output lines and a second voltage source,
   a first impedance means coupled between said first voltage source and one of said pair of said output lines,
   a second impedance means coupled between said first voltage source and the other of said pair of output lines, and
   an imbalance voltage means connected to at least one of said output lines via a third impedance means for imbalancing at least one of said output lines.

2. The circuit of claim 1 wherein said third impedance means includes a variable impedance.

3. The circuit of claim 1 wherein said third impedance means includes a resistor.

4. The circuit of claim 3 wherein said third impedance means includes a semiconductive element coupled to the output line whose voltage is to be varied.

* * * * *